United States Patent
Kitamura

(10) Patent No.: US 6,791,425 B2
(45) Date of Patent: Sep. 14, 2004

(54) LC OSCILLATOR WITH SMALL OSCILLATION FREQUENCY VARIATIONS

(75) Inventor: Masahiro Kitamura, Tokyo (JP)

(73) Assignee: Renesas Technology Corp., Tokyo (JP)

(*) Notice: Subject to any disclaimer, the term of this patent is extended or adjusted under 35 U.S.C. 154(b) by 0 days.

(21) Appl. No.: 10/267,634

(22) Filed: Oct. 10, 2002

(65) Prior Publication Data

US 2003/0189466 A1 Oct. 9, 2003

(30) Foreign Application Priority Data

Apr. 9, 2002 (JP) .......................................... 2002-106504

(51) Int. Cl.$^7$ ................................................. H03B 5/00
(52) U.S. Cl. .............................. 331/117 R; 331/117 FE; 331/177 V; 331/36 C
(58) Field of Search ........................ 331/117 R, 117 FE, 331/36 C, 177 V

(56) References Cited

U.S. PATENT DOCUMENTS 6,323,736 B2 * 11/2001 Jansson ........................ 331/44

* cited by examiner

Primary Examiner—Arnold Kinkead
(74) Attorney, Agent, or Firm—Burns, Doane, Swecker & Mathis, L.L.P.

(57) ABSTRACT

An LC oscillator includes inductors, a variable capacitor section, an adjusting section for varying the capacitance of the variable capacitor section in response to a control voltage supplied in accordance with a digital control signal, and an additional variable capacitor section for varying its capacitance in response to an additional control voltage. The variable capacitor section includes first to Kth capacitors, where K is an integer greater than one. The adjusting section includes buffer section, each of which selectively generates one of a first voltage and a second voltage lower than the first voltage in response to a kth bit of the digital control signal, where k is an integer varying from one to K, thereby generating first to Kth control voltages to be supplied to the first to Kth capacitors.

9 Claims, 10 Drawing Sheets

LC OSCILLATOR WITH SMALL OSCILLATION FREQUENCY VARIATIONS

BACKGROUND OF THE INVENTION

1. Field of the Invention

The present invention relates to an LC oscillator capable of reducing variations in the oscillation frequency.

2. Description of Related Art

The oscillation frequency of an LC oscillator is determined by its inductance and capacitance. Thus, the LC oscillator, which is used for a frequency synthesizer or the like, varies its oscillation frequency by varying its capacitance with its inductance fixed. As an LC oscillator that varies its oscillation frequency by digital control, a CMOS differential LC oscillator is known.

FIG. 17 is a circuit diagram showing a configuration of a conventional CMOS differential LC oscillator. In this figure, reference numerals 1 and 2 each designate an inductor, 3 and 4 each designate a variable capacitor, 5 and 6 each designate an NMOS transistor, and the reference numeral 7 designates a constant current source. The NMOS transistors 5 and 6 are connected in a cross-coupled state, and the variable capacitors 3 and 4 each consist of first to Kth capacitors connected in parallel, where K is an integer greater than one. The variable capacitors 3 and 4 are each controlled by a K-bit digital control signal TUNE. Specifically, the kth capacitor has its capacitance controlled by the kth bit of the digital control signal TUNE to vary the capacitance CT of the variable capacitors 3 and 4.

Thus, the oscillation frequency of the CMOS differential LC oscillator is varied by controlling the capacitance of the variable capacitors 3 and 4 by the digital control signal TUNE. It is designed such that when the capacitance CT1-1 of the first capacitor is adjusted to 1 by the digital control signal TUNE, the capacitance CTK-1 of the Kth capacitor becomes 2(K−1), where CTk-1 represents the capacitance of the kth capacitor. As a result, when controlled by the digital control signal TUNE, the CMOS differential LC oscillator shown in FIG. 17 varies its oscillation frequency discontinuously at every 2(K−1) step. Thus, to continuously vary the capacitance between the steps, an additional analog capacitor (not shown in FIG. 17) is used. Such an additional analog capacitor is connected in parallel with each of the variable capacitors 3 and 4 to be controlled by a control voltage fed from a charge pump circuit, for example. Thus, the analog capacitors vary the oscillation frequency, synchronize the phase and carry out tracking operation.

FIG. 18 is a diagram illustrating relationships between the digital control signal TUNE (TUNE code) and the oscillation frequency. In this figure, as the TUNE code varies from a minimum code (min code) to a maximum code (max code), the oscillation frequency varies continuously from the minimum frequency (fmin) to the maximum frequency (fmax).

The conventional LC oscillator with the foregoing configuration has the following problem. Assume that the line designated by the reference numeral 8 in FIG. 18 represents a desired frequency characteristic of the LC oscillator. In other words, it is designed to meet the characteristic 8. It is unavoidable, however, that a discrepancy occurs between the desired and designed values in the manufacturing process of individual CMOS differential LC oscillators. Thus, it is not unlikely that the CMOS differential LC oscillator cannot satisfy the desired frequency characteristic.

In addition, it is unavoidable that the CMOS differential LC oscillator has variations due to the ambient temperature in its use environment. As a result, as indicated by the reference numeral 10 or 11 in FIG. 18, the frequency characteristic of the CMOS differential LC oscillator can deviated from the desired frequency characteristic, thereby bringing about variations in the frequency characteristic. In this case, the conventional CMOS differential LC oscillator cannot eliminate the variations in the frequency characteristic, presenting a problem of reducing the yield of the CMOS differential LC oscillator.

SUMMARY OF THE INVENTION

The present invention is implemented to solve the foregoing problem. It is therefore an object of the present invention to provide an LC oscillator capable of increasing the yield by correcting the deviation of the frequency characteristic.

According to a first aspect of the present invention, there is provided an LC oscillator including variable capacitor means for varying its capacitance in response to a control voltage supplied in accordance with a digital control signal; additional variable capacitor means for varying its capacitance in response to an additional control voltage; and adjusting means for adjusting the oscillation frequency to one of the maximum oscillation frequency and minimum oscillation frequency by varying the capacitance of the variable capacitor means by the control voltage with fixing the digital control signal, wherein the additional variable capacitor means adjusts the oscillation frequency to the other of the maximum oscillation frequency and minimum oscillation frequency by varying its capacitance by the additional control voltage with fixing the digital control signal.

According to a second aspect of the present invention, there is provided an LC oscillator including variable capacitor means for varying its capacitance in response to a control voltage supplied in accordance with a digital control signal; and adjusting means for adjusting the oscillation frequency to the maximum oscillation frequency and the minimum oscillation frequency by varying a first voltage and a second voltage with fixing the digital control signal, the first voltage and second voltage being selectively supplied to the adjusting means in response to the digital control signal, and the first voltage being higher than the second voltage.

The foregoing configurations can correct the deviation in the frequency characteristic and set the oscillation frequency at a desired oscillation frequency, thereby offering an advantage of being able to improve the yield.

DETAILED DESCRIPTION OF THE PREFERRED EMBODIMENTS

The invention will now be described with reference to the accompanying drawings.

Embodiment 1

Figure 1:
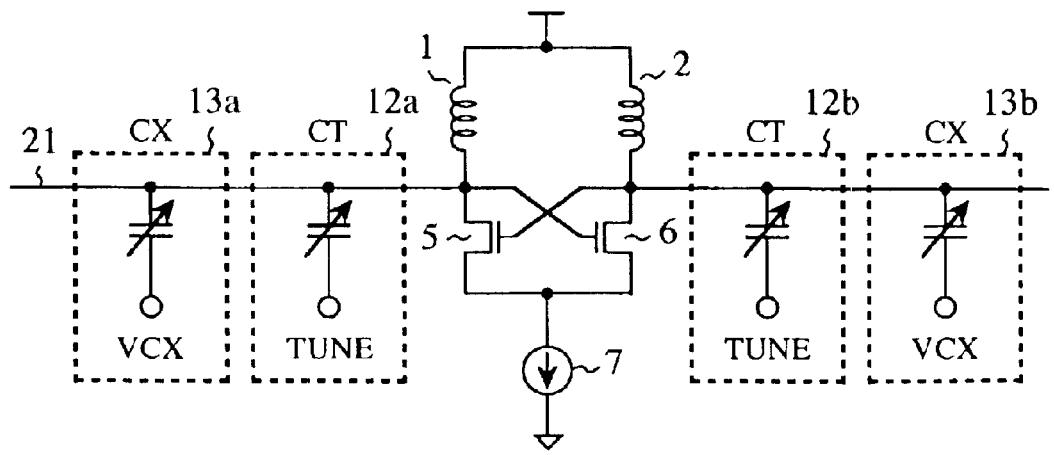
FIG. 1 is a circuit diagram showing a configuration of an LC oscillator of an embodiment 1 in accordance with the present invention.
Figure 17:
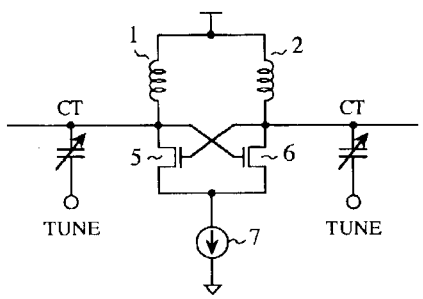
FIG. 17 is a circuit diagram showing a configuration of a conventional LC oscillator.
Figure 18:
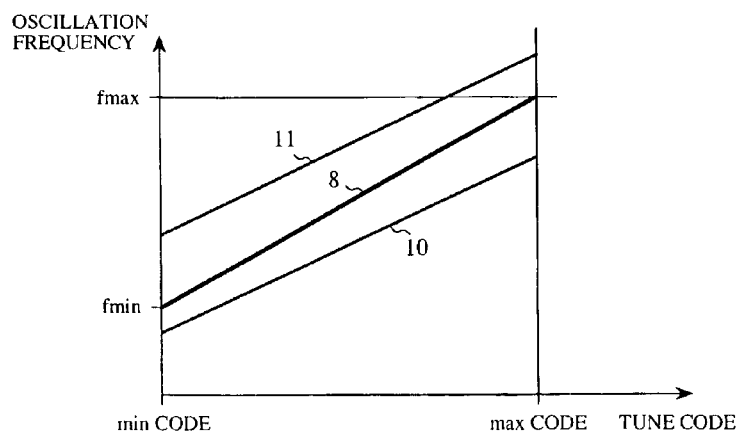
FIG. 18 is a diagram illustrating relationships between the digital control signal (TUNE code) and oscillation frequency in the LC oscillator of FIG. 17.

FIG. 1 is a circuit diagram showing a configuration of an LC oscillator of an embodiment 1 in accordance with the present invention, in which the same components as those of the CMOS differential LC oscillator as shown in FIG. 17 are designated by the same reference numerals. In this figure, reference numerals 12a and 12b designate first and second variable capacitor sections, respectively; and 13a and 13b designate first and second additional variable capacitor sections. The first and second variable capacitor sections 12a and 12b are connected to the gates of the NMOS transistor 6 and 5, respectively. The first and second additional variable capacitor sections 13a and 13b are connected in parallel with the first and second variable capacitor sections 12a and 12b. The first and second variable capacitor sections 12a and 12b are each controlled in response to a K-bit digital control signal TUNE (TUNE code) so that their capacitance is varied. On the other hand, the first and second additional variable capacitor sections 13a and 13b are each controlled in response to an additional control voltage VCX so that their capacitance is varied. Although not shown in the LC oscillator as shown in FIG. 1, the analog capacitors mentioned in connection in FIG. 17 are connected in parallel with the first variable capacitor section 12a and first additional variable capacitor section 13a, and in parallel with the second variable capacitor section 12b and second additional variable capacitor section 13b.

Figure 2:
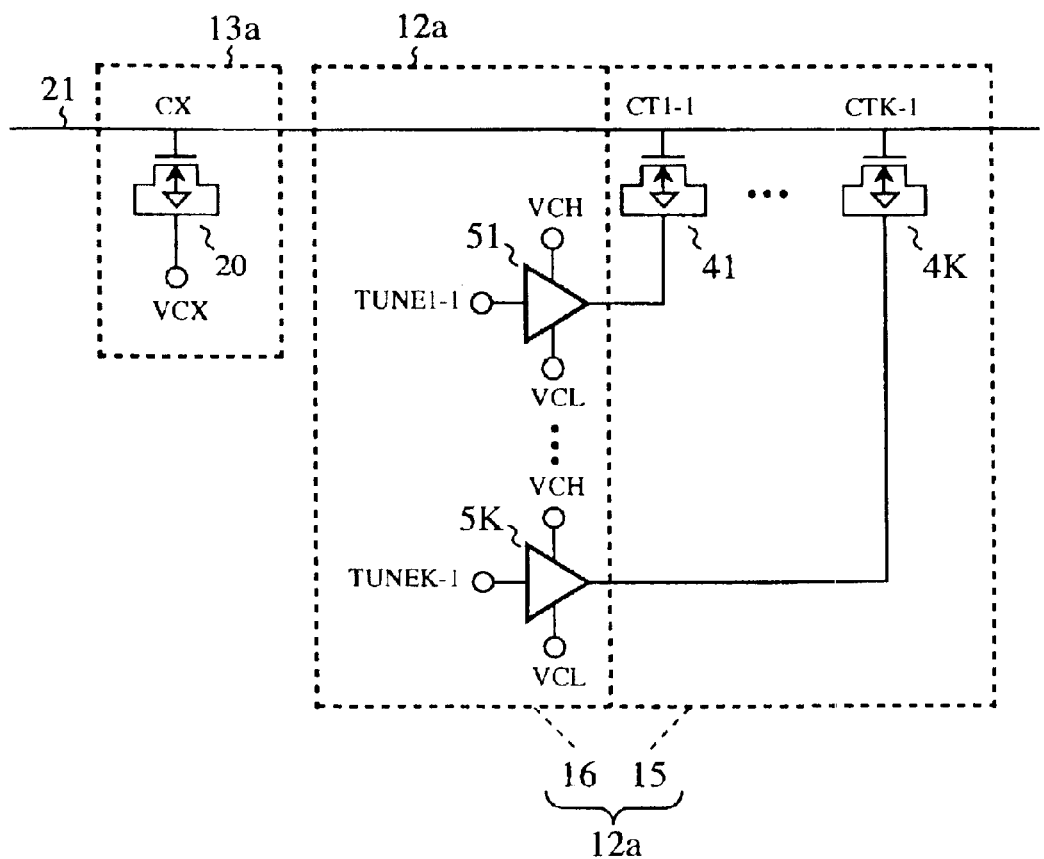
FIG. 2 is a circuit diagram showing a configuration of the variable capacitor section and additional variable capacitor section shown in FIG. 1.

Referring to FIG. 2, let us consider the first variable capacitor section 12a. The first variable capacitor section 12a includes first to Kth NMOS capacitors 41 to 4K, each of which consists of an NMOS transistor having its source and drain connected to each other, and its gate connected to an oscillation node 21. Its capacitance is varied by varying the terminal voltage of the source and drain. Here, the capacitance of the kth NMOS capacitor 4k is denoted by CTk-1.

The first to Kth NMOS capacitors 41 to 4K are connected to first to Kth buffers 51 to 5K, which generate first to Kth control voltages in response to the TUNE code, and supply them to the first to Kth NMOS capacitors 41 to 4K. When the kth bit TUNEk-1 of the TUNE code is logic "1" of a high level, the kth buffer 5k produces a first voltage VCH as the kth control voltage. In contrast, when the kth bit TUNEk-1 of the TUNE code is logic "0" of a low level, the kth buffer 5k produces a second voltage VCL as the kth control voltage, where the second voltage VCL is lower than the first voltage VCH. In FIG. 2, the first to Kth NMOS capacitors 41 to 4K constitute a variable capacitor means 15, and the first to Kth buffers 51 to 5K constitute a capacitor adjusting means 16. Although not shown in FIG. 2, the second variable capacitor section 12b has the same configuration as the first variable capacitor section 12a.

Next, consider the first additional variable capacitor section 13a. It includes an NMOS capacitor 20 having its source and drain connected to each other, and its gate connected to an oscillation node 21. Its capacitance is varied by varying the terminal voltage of the source and drain. Here, the capacitance of the NMOS capacitor 20 is denoted by CX, and is supplied with an additional control voltage VCX as its terminal voltage. The second additional variable capacitor section 13b has the same configuration as the first additional variable capacitor section 13a.

Figure 3:
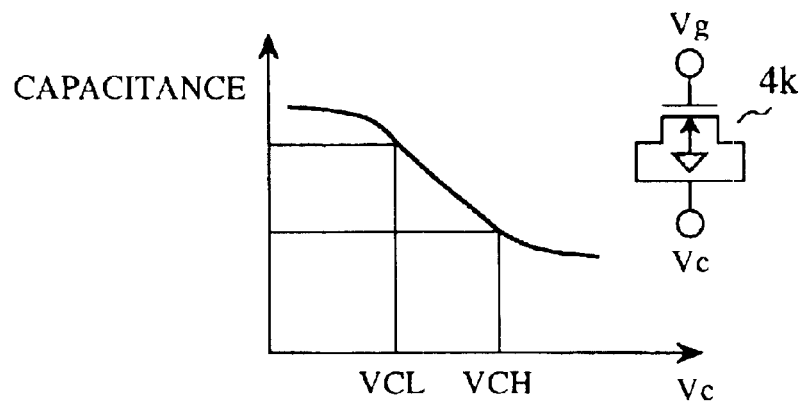
FIG. 3 is a graph illustrating the relationships between the gate-drain voltage and capacitance of an NMOS capacitor constituting the variable capacitor section as shown in FIG. 1.

Next, the operation of the present embodiment 1 will be described with reference to FIG. 3 along with FIGS. 1 and 2.

When the kth bit of the TUNE code is at the low level, the source-drain of the kth NMOS capacitor 4k is supplied with the kth control voltage (terminal voltage) of the second voltage VCL. The capacitance of the kth NMOS capacitor 4k increases when the source-drain voltage Vc is low, that is, when it is the second voltage VCL. Here, Vg denotes the gate voltage. In contrast, when the kth bit of the TUNE code is at the high level, the source-drain of the kth NMOS capacitor 4k is supplied with the kth control voltage of the first voltage VCH. The capacitance of the kth NMOS capacitor 4k reduces when the source-drain voltage Vc is high, that is, when it is the first voltage VCH.

As a result, as the value of the TUNE code decreases, the capacitance (total capacitance) of the first and second variable capacitor sections 12a and 12b increases and the oscillation frequency of the LC oscillator decreases. In contrast, as the value of the TUNE code increases, the capacitance (total capacitance) of the first and second variable capacitor sections 12a and 12b decreases and the oscillation frequency of the LC oscillator increases.

This holds true for the first and second additional variable capacitor sections 13a and 13b: as the additional control voltage VCX decreases, the capacitance of the NMOS capacitor 20 increases and the oscillation frequency reduces; whereas as the additional control voltage VCX increases, the capacitance of the NMOS capacitor 20 reduces and the oscillation frequency increases.

Figure 4:
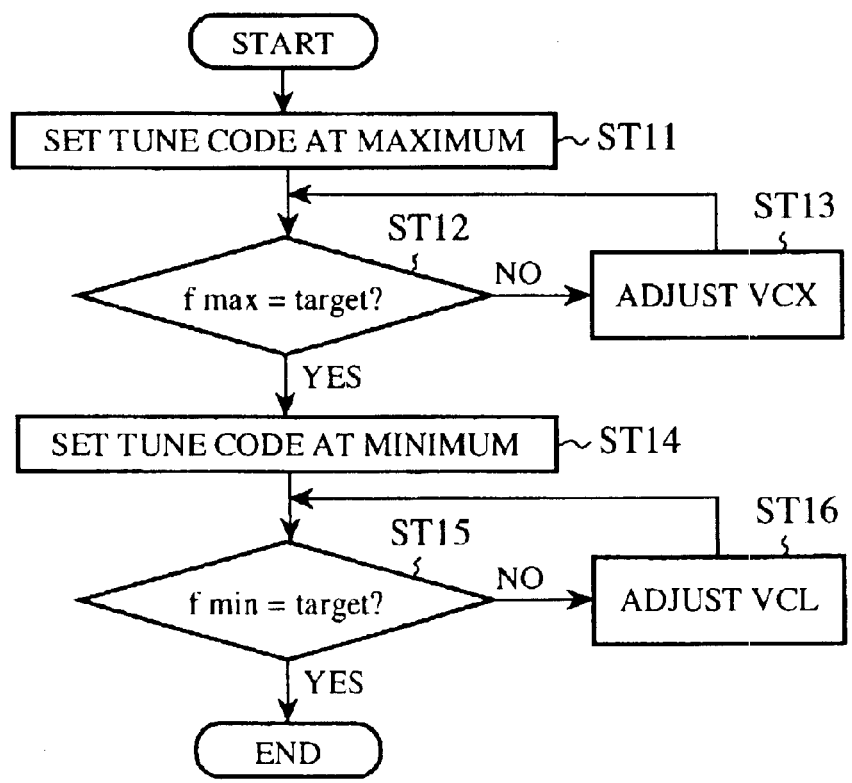
FIG. 4 is a flowchart illustrating an example of the oscillation frequency adjustment of the LC oscillator as shown in FIG. 1.

Referring to FIG. 4, an example of the oscillation frequency adjustment of the CMOS differential LC oscillator as shown in FIG. 1 will be described.

First, the TUNE code is set at its maximum value (step ST11), and the oscillation frequency (maximum oscillation frequency fmax) is measured. Subsequently, a decision is made as to whether the maximum oscillation frequency is a desired (target) maximum oscillation frequency (design maximum oscillation frequency) (fmax=target: step ST12) or not. If fmax≠target, the additional control voltage VCX is varied (step ST13), and the fmax is measured again. In this way, the additional control voltage VCX is adjusted until the fmax becomes the desired maximum oscillation frequency. For example, when the fmax is lower than the desired maximum oscillation frequency, the additional control voltage VCX is increased to increase the oscillation frequency, thereby setting the fmax at the desired maximum frequency.

Second, the TUNE code is set at its minimum value (step ST14), and the oscillation frequency (minimum oscillation frequency fmin) is measured. Subsequently, a decision is made as to whether the minimum oscillation frequency is a desired (target) minimum oscillation frequency (design minimum oscillation frequency) (fmin=target: step ST15) or not. If fmin≠target, the second voltage VCL is varied (step ST16), and the fmin is measured again. In this way, the second voltage VCL is adjusted until the fmin becomes the desired minimum oscillation frequency.

Thus, when the TUNE code is the maximum value, the capacitance of the first and second variable capacitor sections 12a and 12b is determined by the first voltage VCH independently of the second voltage VCL. Therefore, the maximum oscillation frequency and minimum oscillation frequency can be adjusted independently in response to the TUNE code with the maximum value and minimum value. As a result, adjusting the oscillation frequency in this way makes it possible to adjust the maximum oscillation frequency and minimum oscillation frequency at the desired maximum oscillation frequency and desired minimum oscillation frequency. Thus, the frequency step interval (oscillation frequency interval) based on the TUNE code can be adjusted very close to the theoretical value (design value).

In this way, adjusting the maximum oscillation frequency in advance using the first and second additional variable capacitor sections 13a and 13b makes it possible to set the oscillation frequency at the desired oscillation frequency in response to the TUNE code.

Figure 5:
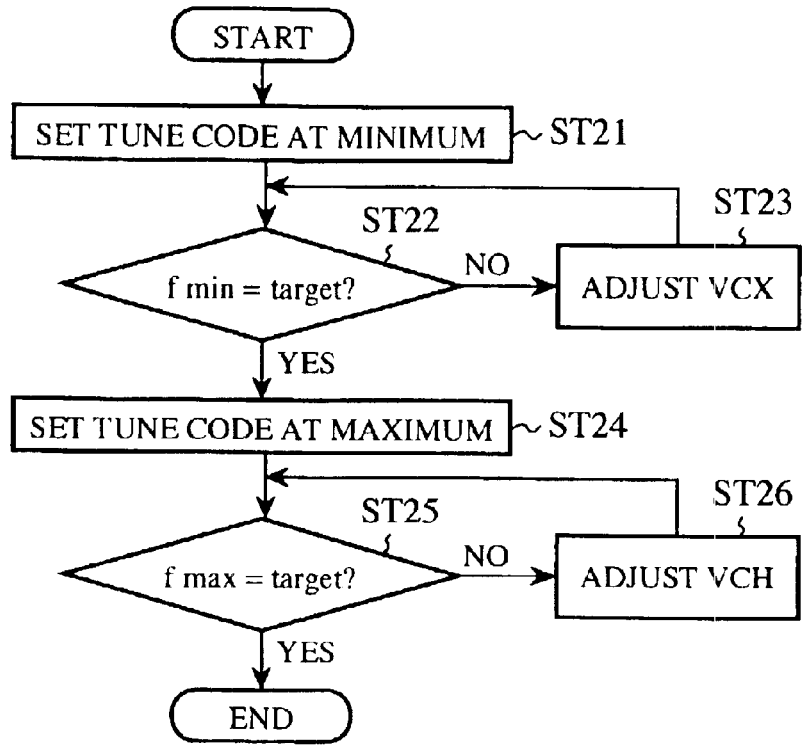
FIG. 5 is a flowchart illustrating another example of the oscillation frequency adjustment of the LC oscillator as shown in FIG. 1.

Referring to FIG. 5, another example of the oscillation frequency adjustment of the CMOS differential LC oscillator as shown in FIG. 1 will be described.

First, the TUNE code is set at its minimum value (step ST21), and the oscillation frequency (minimum oscillation frequency fmin) is measured. Subsequently, a decision is made as to whether the minimum oscillation frequency is a desired minimum oscillation frequency (fmin=target: step ST22) or not. If fmin≠target, the additional control voltage VCX is varied (step ST23), and the fmin is measured again. In this way, the additional control voltage VCX is adjusted until the fmin becomes the desired minimum oscillation frequency. For example, when the fmin is higher than the desired minimum oscillation frequency, the additional control voltage VCX is decreased to reduce the oscillation frequency, thereby setting the fmin at the desired minimum frequency.

Second, the TUNE code is set at its maximum value (step ST24), and the oscillation frequency (maximum oscillation frequency fmax) is measured. Subsequently, a decision is made as to whether the maximum oscillation frequency is a desired (target) maximum oscillation frequency (fmax=target: step ST25) or not. If fmax≠target, the first voltage VCH is varied (step ST26), and the fmax is measured again. In this way, the first voltage VCH is adjusted until the fmax becomes the desired maximum oscillation frequency.

Thus, when the TUNE code is the minimum value, the capacitance of the first and second variable capacitor sections 12a and 12b is determined by the second voltage VCL independently of the first voltage VCH. Therefore, the maximum oscillation frequency and minimum oscillation frequency can be adjusted independently in response to the TUNE code with the maximum value and minimum value. As a result, adjusting the oscillation frequency in this way makes it possible to adjust the maximum oscillation frequency and minimum oscillation frequency at the desired maximum oscillation frequency and desired minimum oscillation frequency. Thus, the frequency step interval (oscillation frequency interval) based on the TUNE code can be adjusted very close to the theoretical value (design value).

In this way, adjusting the minimum oscillation frequency in advance using the first and second additional variable capacitor sections 13a and 13b makes it possible to set the oscillation frequency at the desired oscillation frequency in response to the TUNE code.

As described above, the present embodiment 1 is configured such that its maximum oscillation frequency or minimum oscillation frequency is adjusted using the first and second additional variable capacitor sections whose capacitance varies in response to the additional control voltage. Accordingly, it can set the oscillation frequency at the desired oscillation frequency in response to the TUNE code. Thus, the present embodiment 1 can correct the deviation of the frequency characteristic, and set the oscillation frequency at a desired value in response to the TUNE code, thereby being able to increase the yield.

Embodiment 2

Figure 6:
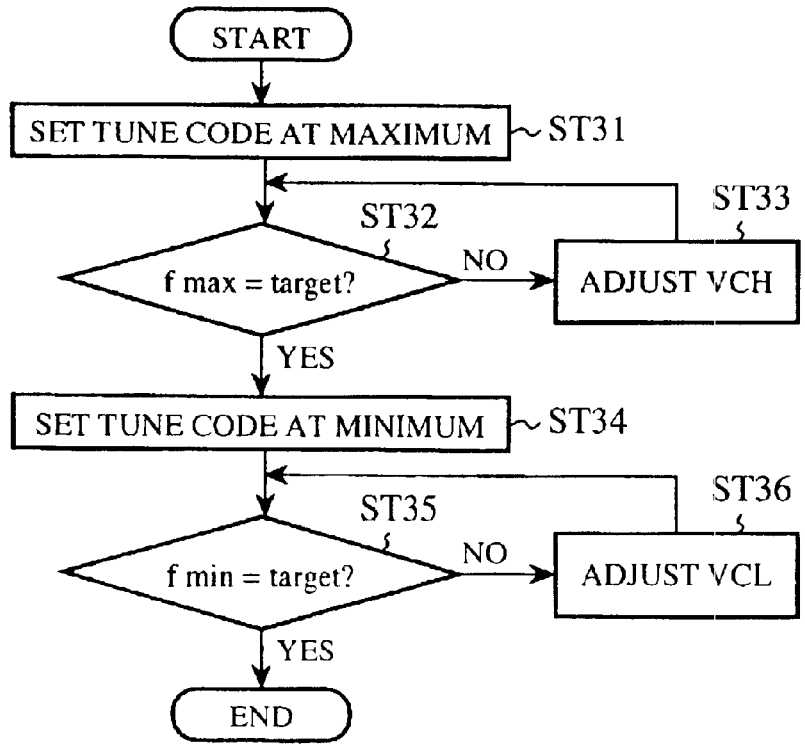
FIG. 6 is a flowchart illustrating an example of the oscillation frequency adjustment of the LC oscillator of an embodiment 2 in accordance with the present invention.

FIG. 6 is a flowchart illustrating an example of the oscillation frequency adjustment in the LC oscillation circuit of an embodiment 2 in accordance with the present invention. In the present embodiment 2, the first and second additional variable capacitor sections 13a and 13b are removed from the LC oscillation circuit as shown in FIG. 1, and the first and second voltages VCH and VCL are adjusted as described below.

Referring to FIG. 6, the operation of the present embodiment 2 will be described. First, the TUNE code is set at its maximum value (step ST31), and the fmax is measured. Subsequently, a decision is made as to whether the fmax is a desired maximum oscillation frequency (fmax=target: step ST32) or not. If fmax≠target, the first voltage VCH is varied (step ST33), and the fmax is measured again. In this way, the first voltage VCH is adjusted until the fmax becomes the desired maximum oscillation frequency.

Second, the TUNE code is set at its minimum value (step ST34), and the minimum oscillation frequency fmin is measured. Subsequently, a decision is made as to whether the minimum oscillation frequency is a desired minimum oscillation frequency (fmin=target: step ST35) or not. If fmin≠target, the second voltage VCL is varied (step ST36), and the fmin is measured again. In this way, the second voltage VCL is adjusted until the fmin becomes the desired minimum oscillation frequency.

Figure 7:
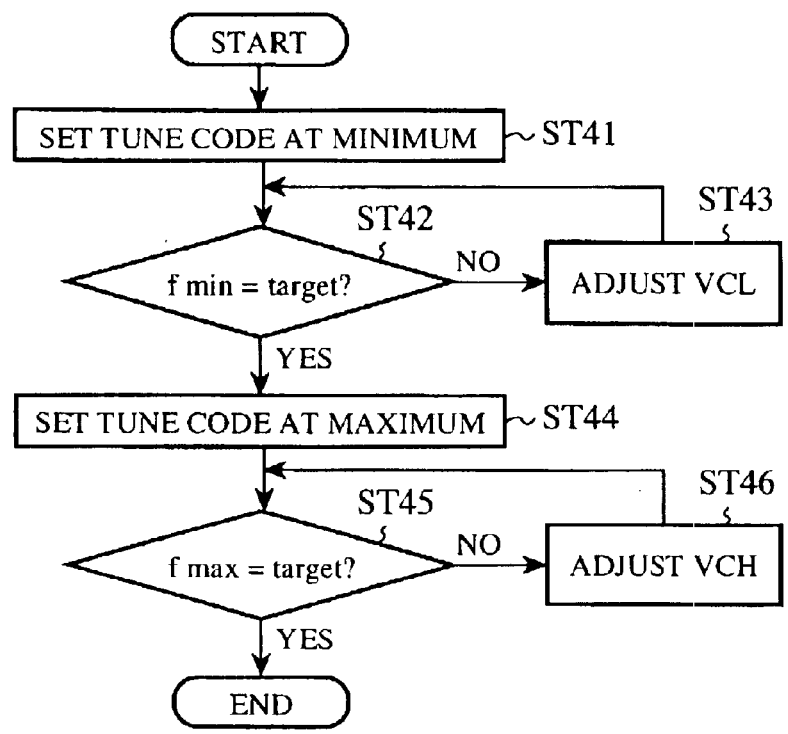
FIG. 7 is a flowchart illustrating another example of the oscillation frequency adjustment of the LC oscillator of the embodiment 2 in accordance with the present invention.

Incidentally, the second voltage VCL can be adjusted first, followed by the adjustment of the first voltage VCH as illustrated in FIG. 7. In this case, the TUNE code is set at its minimum value (step ST41), and the minimum oscillation frequency fmin is measured. Subsequently, a decision is made as to whether the fmin is a desired minimum oscillation frequency (fmin=target: step ST42) or not. If fmin≠target, the second voltage VCL is varied (step ST43), and the fmin is measured again. In this way, the second voltage VCL is adjusted until the fmin becomes the desired minimum oscillation frequency.

Second, the TUNE code is set at its maximum value (step ST44), and the maximum oscillation frequency fmax is measured. Subsequently, a decision is made as to whether the fmax is a desired maximum oscillation frequency (fmax=target: step ST45) or not. If fmax≠target, the first voltage VCH is varied (step ST46), and the fmax is measured again. In this way, the first voltage VCH is adjusted until the fmax becomes the desired maximum oscillation frequency.

Thus, the maximum oscillation frequency and minimum oscillation frequency can be adjusted to the desired maximum oscillation frequency and desired minimum oscillation frequency, respectively. As a result, the frequency step interval (oscillation frequency interval) based on the TUNE code can be adjusted very close to the theoretical value (design value).

In this way, adjusting the first and second voltages VCH and VCL makes it possible to set the oscillation frequency at the desired oscillation frequency in response to the TUNE code.

As described above, the present embodiment 2 is configured such that its maximum oscillation frequency and minimum oscillation frequency are adjusted by controlling the first and second voltages. Accordingly, it can set the oscillation frequency at the desired oscillation frequency in response to the TUNE code. As a result, the present embodiment 2 can correct the deviation of the frequency characteristic, and set the oscillation frequency at the desired oscillation frequency in response to the TUNE code, thereby being able to increase the yield.

Embodiment 3

Figure 8:
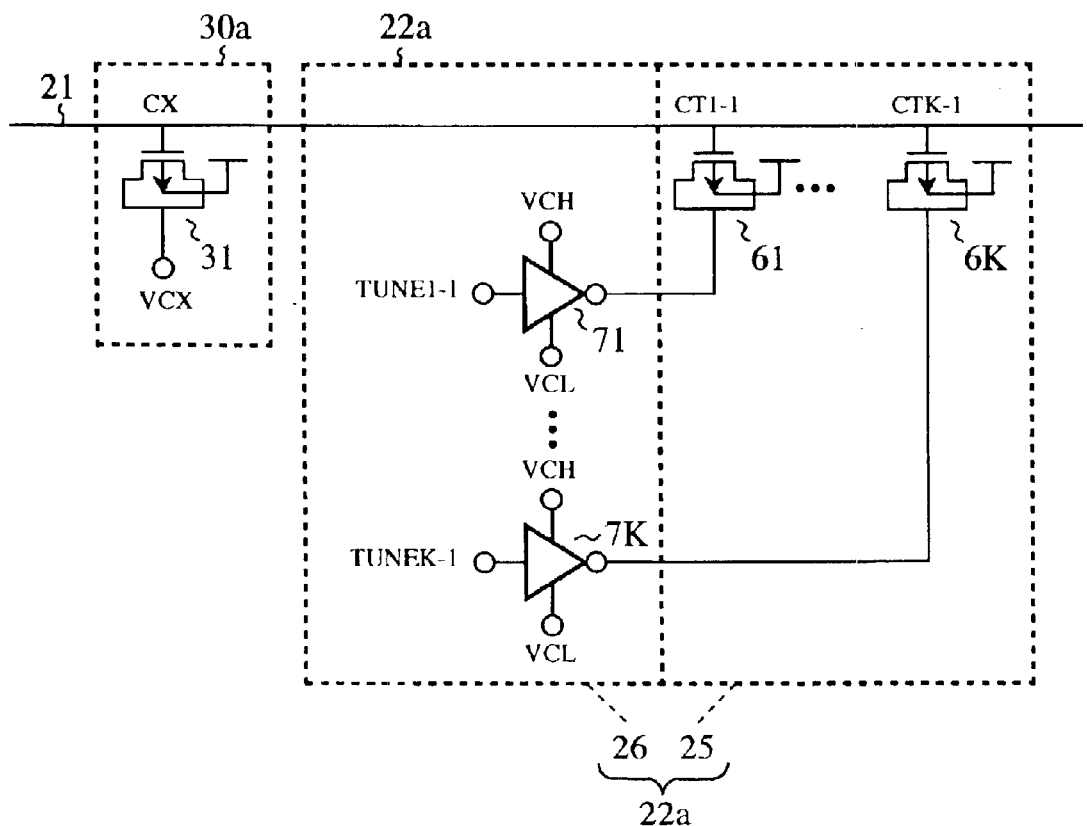
FIG. 8 is a circuit diagram showing a configuration of the variable capacitor section and additional variable capacitor section of the LC oscillator of an embodiment 3 in accordance with the present invention.

The present embodiment 3 uses first and second variable capacitor sections 22a and 22b, and first and second additional variable capacitor sections 30a and 30b as shown in FIG. 8 in place of the first and second variable capacitor sections 12a and 12b, and the first and second additional variable capacitor sections 13a and 13b of the CMOS differential LC oscillator as shown in FIG. 1. The first and second variable capacitor sections 22a and 22b have the same configuration, and the first and second additional variable capacitor sections 30a and 30b have the same configuration.

FIG. 8 is a circuit diagram showing a configuration of the first variable capacitor section 22a and the first additional variable capacitor section 30a. In FIG. 8, the same components as those of FIG. 2 are designated by the same reference numerals. Referring to FIG. 8, let us consider the first variable capacitor section 22a. It includes first to Kth PMOS capacitors 61 to 6K, each of which consists of a PMOS transistor having its gate connected to an oscillation node 21. Its capacitance is varied by varying the terminal voltage of the source and drain. Here, the capacitance of the kth PMOS capacitor 6k is denoted by CTk-1.

The first to Kth PMOS capacitors 61 to 6K are connected to first to Kth buffers 71 to 7K, which generate first to Kth control voltages in response to the TUNE code, and supply them to the first to Kth PMOS capacitors 61 to 6K. When the kth bit TUNEk-1 of the TUNE code is logic "1" of the high level, the kth buffer 7k produces the second voltage VCL. In contrast, when the kth bit TUNEk-1 of the TUNE code is logic "0" of the low level, the kth buffer 7k produces the first voltage VCH, where the second voltage VCL is lower than the first voltage VCH. In FIG. 8, the first to Kth PMOS capacitors 61 to 6K constitute a variable capacitor means 25, and the first to Kth buffers 71-7K constitute a capacitor adjusting means 26.

Next, consider the first additional variable capacitor section 30a. It includes a PMOS capacitor 31. Here, the capacitance of the PMOS capacitor 31 is denoted by CX, and supplied with an additional control voltage VCX as its terminal voltage.

Figure 9:
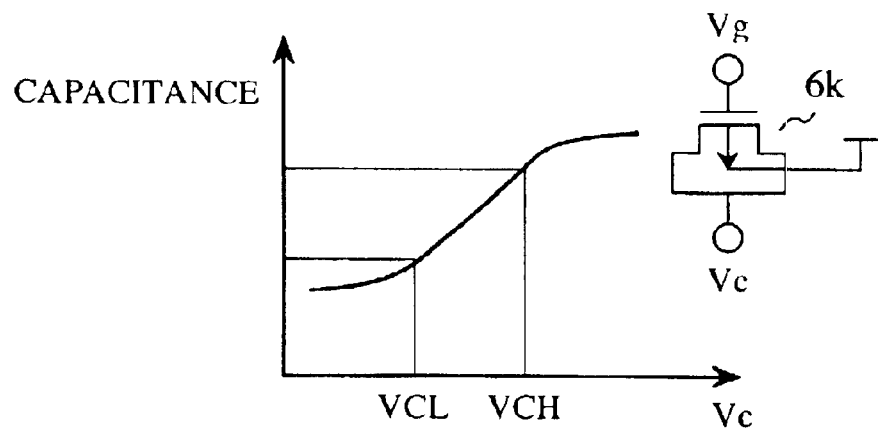
FIG. 9 is a graph illustrating the relationships between the gate-drain voltage and capacitance of a PMOS capacitor constituting the variable capacitor section as shown in FIG. 8.

Next, the operation of the present embodiment 3 will be described with reference to FIG. 9 along with FIG. 8.

When the kth bit of the TUNE code is at the high level, the source-drain of the kth PMOS capacitor 6k is supplied with the kth control voltage (terminal voltage) of the second voltage VCL. The capacitance of the kth PMOS capacitor 6k reduces when the source-drain voltage Vc is low, that is, when it is the second voltage VCL. Here, Vg denotes the gate voltage. In contrast, when the kth bit of the TUNE code is at the low level, the source-drain of the kth PMOS capacitor 6k is supplied with the kth control voltage of the first voltage VCH. The capacitance of the kth PMOS capacitor 6k increases when the source-drain voltage Vc is high, that is, when it is the first voltage VCH.

As a result, as the value of the TUNE code decreases, the capacitance (total capacitance) of the first and second variable capacitor sections 22a and 22b increases and the oscillation frequency of the LC oscillator decreases. In contrast, as the value of the TUNE code increases, the capacitance (total capacitance) of the first and second variable capacitor sections 22a and 22b decreases and the oscillation frequency of the LC oscillator increases.

As for the first and second additional variable capacitor sections 30a and 30b, as the additional control voltage VCX decreases, the capacitance of the PMOS capacitor 31 decreases and the oscillation frequency increases. In contrast, as the additional control voltage VCX increases, the capacitance of the PMOS capacitor 31 increases and the oscillation frequency reduces.

Figure 10:
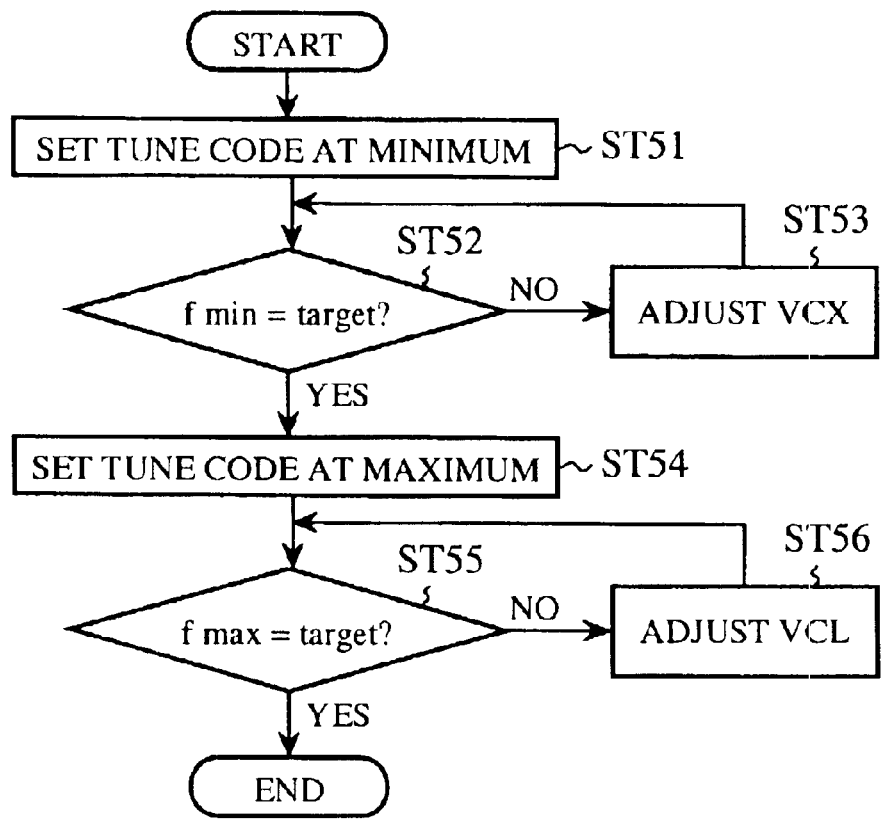
FIG. 10 is a flowchart illustrating an example of the oscillation frequency adjustment of the LC oscillator as shown in FIG. 8.

Referring to FIG. 10, an example of the oscillation frequency adjustment of the CMOS differential LC oscillator as shown in FIG. 8 will be described.

First, the TUNE code is set at its minimum value (step ST51), and the minimum oscillation frequency fmin is measured. Subsequently, a decision is made as to whether the minimum oscillation frequency is a desired minimum oscillation frequency (fmin=target: step ST52) or not. If fmin≠target, the additional control voltage VCX is varied (step ST53), and the fmin is measured again. In this way, the additional control voltage VCX is adjusted until the fmin becomes the desired minimum oscillation frequency.

Second, the TUNE code is set at its maximum value (step ST54), and the maximum oscillation frequency fmax is measured. Subsequently, a decision is made as to whether the maximum oscillation frequency is a desired maximum oscillation frequency (fmax=target: step ST55) or not. If fmax≠target, the second voltage VCL is varied (step ST56), and the fmax is measured again. In this way, the second voltage VCL is adjusted until the fmax becomes the desired maximum oscillation frequency.

Thus, the maximum oscillation frequency and minimum oscillation frequency can be adjusted independently in response to the TUNE code with the maximum value and minimum value. As a result, adjusting the oscillation frequency in this way makes it possible to adjust the maximum oscillation frequency and minimum oscillation frequency at the desired maximum oscillation frequency and desired minimum oscillation frequency. Thus, the frequency step interval (oscillation frequency interval) based on the TUNE code can be adjusted very close to the theoretical value (design value).

In this way, adjusting the minimum oscillation frequency in advance using the first and second additional variable capacitor sections 30a and 30b makes it possible to set the oscillation frequency at the desired oscillation frequency in response to the TUNE code.

Figure 11:
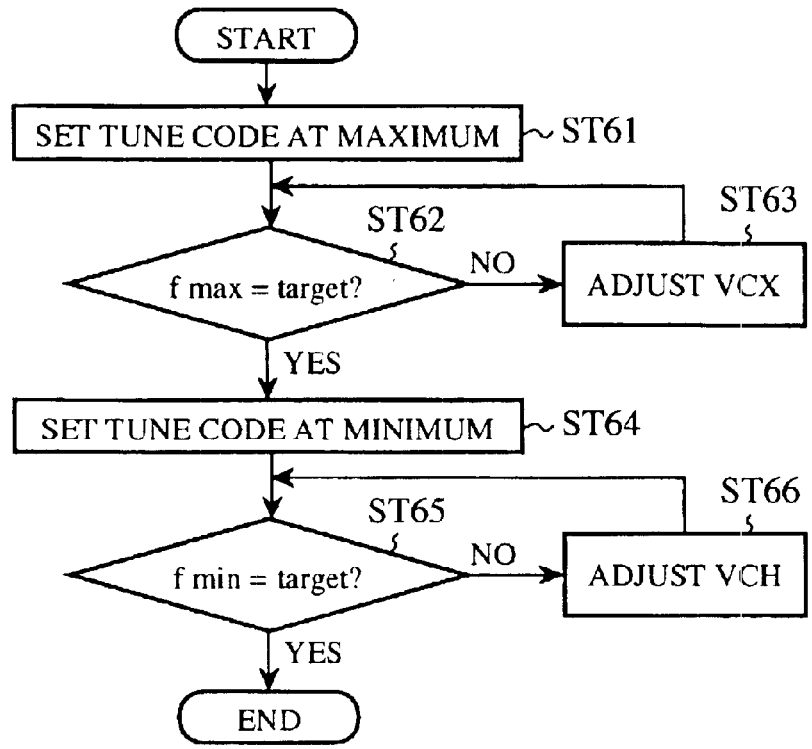
FIG. 11 is a flowchart illustrating another example of the oscillation frequency adjustment of the LC oscillator as shown in FIG. 8.

Referring to FIG. 11, another example of the oscillation frequency adjustment of the CMOS differential LC oscillator as shown in FIG. 8 will be described.

First, the TUNE code is set at its maximum value (step ST61), and the maximum oscillation frequency fmax is measured. Subsequently, a decision is made as to whether the maximum oscillation frequency is a desired maximum oscillation frequency (fmax=target: step ST62) or not. If fmax≠target, the additional control voltage VCX is varied (step ST63), and the fmax is measured again. In this way, the additional control voltage VCX is adjusted until the fmax becomes the desired maximum oscillation frequency.

Second, the TUNE code is set at its minimum value (step ST64), and the minimum oscillation frequency fmin is measured. Subsequently, a decision is made as to whether the minimum oscillation frequency is a desired minimum oscillation frequency (fmin=target: step ST65) or not. If fmin≠target, the first voltage VCH is varied (step ST66), and the fmin is measured again. In this way, the first voltage VCH is adjusted until the fmin becomes the desired minimum oscillation frequency.

Thus, for the TUNE code with the maximum value and the minimum value, the maximum oscillation frequency and the minimum oscillation frequency are adjusted independently. As a result, adjusting the oscillation frequency in this way makes it possible to adjust the maximum oscillation frequency and minimum oscillation frequency at the desired maximum oscillation frequency and desired minimum oscillation frequency, respectively. Thus, the frequency step interval (oscillation frequency interval) based on the TUNE code can be adjusted very close to the theoretical value (design value).

In this way, adjusting the maximum oscillation frequency in advance using the first and second additional variable capacitor sections 30a and 30b makes it possible to set the oscillation frequency at the desired oscillation frequency in response to the TUNE code.

As described above, the present embodiment 3 is configured such that its maximum oscillation frequency or minimum oscillation frequency is adjusted using the first and second additional variable capacitor sections whose capacitance varies in response to the additional control voltage. Accordingly, it can set the oscillation frequency at the desired oscillation frequency in response to the TUNE code. Thus, the present embodiment 3 can correct the deviation of the frequency characteristic, and set the oscillation frequency at the desired oscillation frequency in response to the TUNE code, thereby being able to increase the yield.

Embodiment 4

Figure 12:
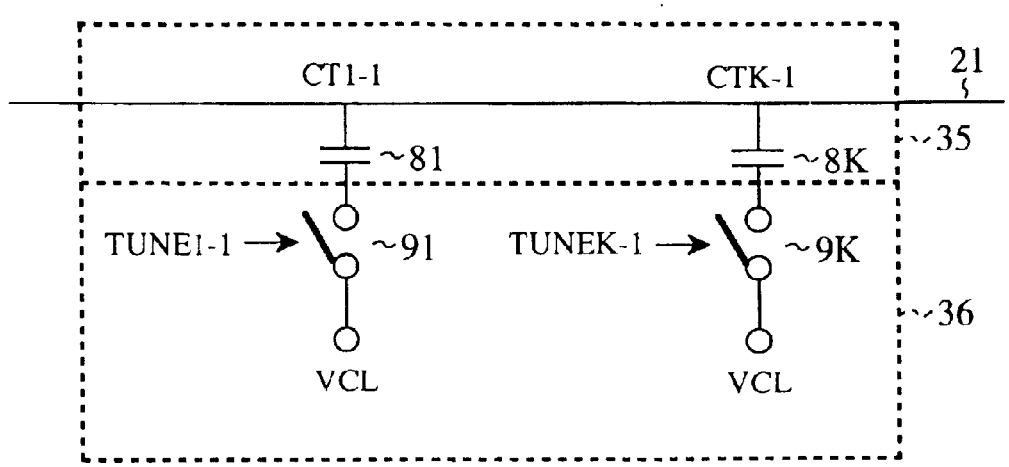
FIG. 12 is a circuit diagram showing a configuration of the variable capacitor section of the LC oscillator of an embodiment 4 in accordance with the present invention.

The present embodiment 4 uses first and second variable capacitor sections 32a and 32b as shown in FIG. 12 in place of the first and second variable capacitor sections 12a and 12b of the CMOS differential LC oscillator as shown in FIG. 1. The first and second variable capacitor sections 32a and 32b have the same configuration.

Figure 13:
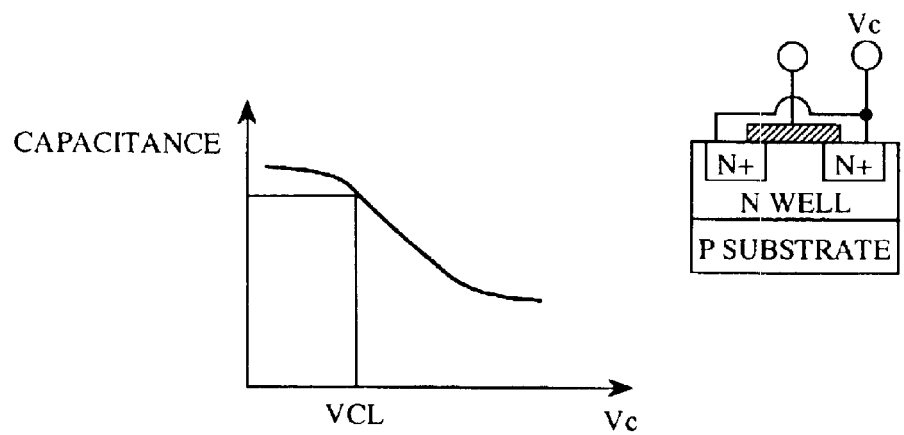
FIG. 13 is a graph illustrating the relationships between the gate-drain voltage and capacitance of an accumulation type PMOS capacitor constituting the variable capacitor section as shown in FIG. 12.

FIG. 12 is a circuit diagram showing a configuration of the first variable capacitor section 32a. In FIG. 12, the first variable capacitor section 32a includes first to Kth accumulation PMOS capacitors 81 to 8K, which are connected to first to Kth switches 91 to 9K, respectively. The first to Kth switches 91 to 9K are supplied with the second voltage VCL. The kth accumulation PMOS capacitor 8k consists of a PMOS transistor having its gate connected to the oscillation node 21 and its source-drain connected to the kth switch 9k. Here, the capacitance of the kth accumulation PMOS capacitor 8k is denoted by CTk-1. In FIG. 12, the first to Kth accumulation PMOS capacitors 81 to 8K constitute a variable capacitor means 35, and the first to Kth switches 91 to 9K constitute a capacitor adjusting means 36. Incidentally, when the kth switch 9k consists of an NMOS transistor, the kth accumulation NMOS capacitor 8k and kth switch 9k have the configuration as shown in FIG. 13.

Next, the operation of the present embodiment 4 will be described with reference to FIGS. 12 and 13.

Assume that the kth switch 9k is composed of an NMOS transistor. When the kth bit of the TUNE code is at the low level, the kth switch 9k is made off. Accordingly, the source-drain terminal of the kth accumulation PMOS capacitor 8k opens, disconnecting the kth accumulation PMOS capacitor 8k from the oscillation node 21.

In contrast, when the kth bit of the TUNE code is at the high level, the kth switch 9k is made on so that the source-drain voltage (terminal voltage) Vc of the kth accumulation PMOS capacitor 8k becomes the second voltage VCL. As a result, a capacitance caused by the difference between the oscillation node voltage and the second voltage VCL is added to the oscillation node 21. As illustrated in FIG. 13, the capacitance reduces with an increase in the second voltage VCL, and increases with a decrease in the second voltage VCL.

As the value of the TUNE code increases, the capacitance (total capacitance) of the first and second variable capacitor sections 32a and 32b increases, and hence the oscillation frequency of the LC oscillator reduces. In contrast, as the value of the TUNE code reduces, the capacitance (total capacitance) of the first and second variable capacitor sections 32a and 32b decreases, and hence the oscillation frequency of the LC oscillator increases.

When the first and second variable capacitor sections 32a and 32b as shown in FIG. 12 are used, for example, the adjustment of the maximum oscillation frequency and minimum oscillation frequency are carried out in an analogous manner to that illustrated in FIG. 4.

Thus, adjusting the minimum oscillation frequency in advance using the first and second additional variable capacitor section 32a and 32b makes it possible to set the oscillation frequency at the desired oscillation frequency in response to the TUNE code.

As described above, the present embodiment 4 is configured such that its maximum oscillation frequency or minimum oscillation frequency is adjusted using the first and second additional variable capacitor sections whose capacitance varies in response to the additional control voltage. Accordingly, it can set the oscillation frequency at the desired oscillation frequency in response to the TUNE code. Thus, the present embodiment 4 can correct the deviation of the frequency characteristic, and set the oscillation frequency at the desired oscillation frequency in response to the digital control signal, thereby being able to increase the yield.

Embodiment 5

Figure 14:
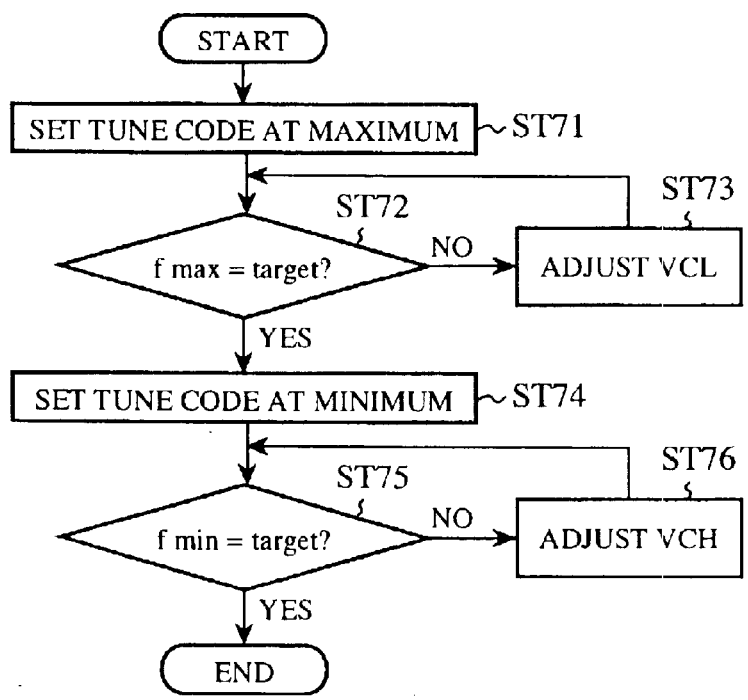
FIG. 14 is a flowchart illustrating an example of the oscillation frequency adjustment of the LC oscillator of an embodiment 5 in accordance with the present invention.

FIG. 14 is a flowchart illustrating an example of the oscillation frequency adjustment of the oscillation circuit of an embodiment 5 in accordance with the present invention. In the present embodiment 5, the first and second additional variable capacitor sections 30a and 30b as shown FIG. 8 are removed, and the first and second voltages VCH and VCL are adjusted as described below.

Referring to FIG. 14, the operation of the present embodiment 5 will be described.

First, the TUNE code is set at its maximum value (step ST71), and the maximum oscillation frequency fmax is measured. Subsequently, a decision is made as to whether the fmax is a desired maximum oscillation frequency (fmax=target: step ST72) or not. If fmax≠target, the second voltage VCL is varied (step ST73), and the fmax is measured again. In this way, the second voltage VCL is adjusted until the fmax becomes the desired maximum oscillation frequency.

Second, the TUNE code is set at its minimum value (step ST74), and the minimum oscillation frequency fmin is measured. Subsequently, a decision is made as to whether the fmin is a desired minimum oscillation frequency (fmin=target: step ST65) or not. If fmin≠target, the first voltage VCH is varied (step ST76), and the fmin is measured again. In this way, the first voltage VCH is adjusted until the fmin becomes the desired minimum oscillation frequency.

Figure 15:
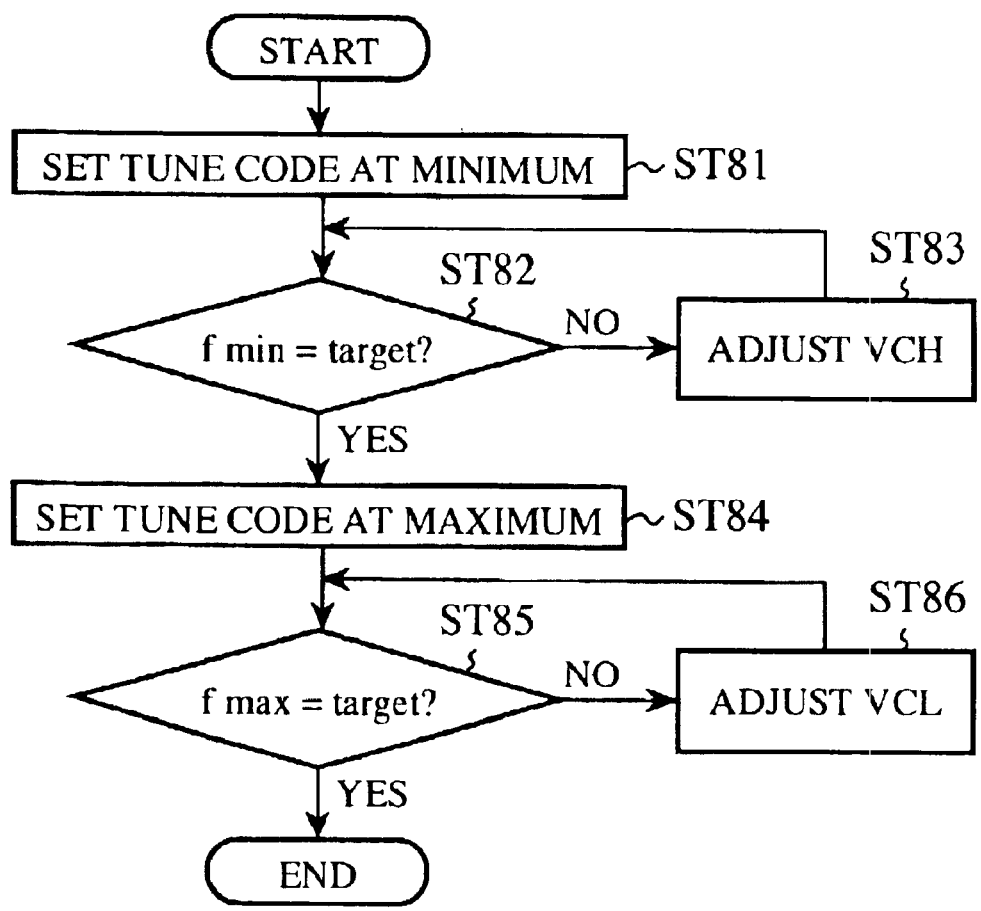
FIG. 15 is a flowchart illustrating another example of the oscillation frequency adjustment of the LC oscillator of the embodiment 5 in accordance with the present invention.

Incidentally, it is also possible to adjust the first voltage VCH, first, followed by the adjustment of the second voltage VCL as illustrated in FIG. 15. Specifically, the TUNE code is set at its minimum value (step ST81), and the minimum oscillation frequency fmin is measured. Subsequently, a decision is made as to whether the fmin is a desired minimum oscillation frequency (fmin=target: step ST82) or not. If fmin≠target, the first voltage VCH is varied (step ST83), and the fmin is measured again. In this way, the first voltage VCH is adjusted until the fmin becomes the desired minimum oscillation frequency.

Subsequently, the TUNE code is set at its maximum value (step ST84), and the maximum oscillation frequency fmax is measured. Then, a decision is made as to whether the fmax is a desired maximum oscillation frequency (fmax=target: step ST85) or not. If fmax≠target, the second voltage VCL is varied (step ST86), and the fmax is measured again. In this way, the second voltage VCL is adjusted until the fmax becomes the desired maximum oscillation frequency.

In this way, it possible to adjust the maximum oscillation frequency and minimum oscillation frequency at the desired maximum oscillation frequency and desired minimum oscillation frequency, respectively. Thus, the frequency step interval (oscillation frequency interval) based on the TUNE code can be adjusted very close to the theoretical value (design value).

Thus adjusting the first and second voltages VCH and VCL makes it possible to set the oscillation frequency at the desired oscillation frequency in response to the TUNE code.

As described above, the present embodiment 5 is configured such that its maximum oscillation frequency and minimum oscillation frequency are adjusted by controlling the first and second voltages. Accordingly, it can set the oscillation frequency at the desired oscillation frequency in response to the TUNE code. In other words, the present embodiment 5 can correct the deviation of the frequency characteristic, and set the oscillation frequency at the desired oscillation frequency in response to the TUNE code, thereby being able to increase the yield.

Embodiment 6

Figure 16:
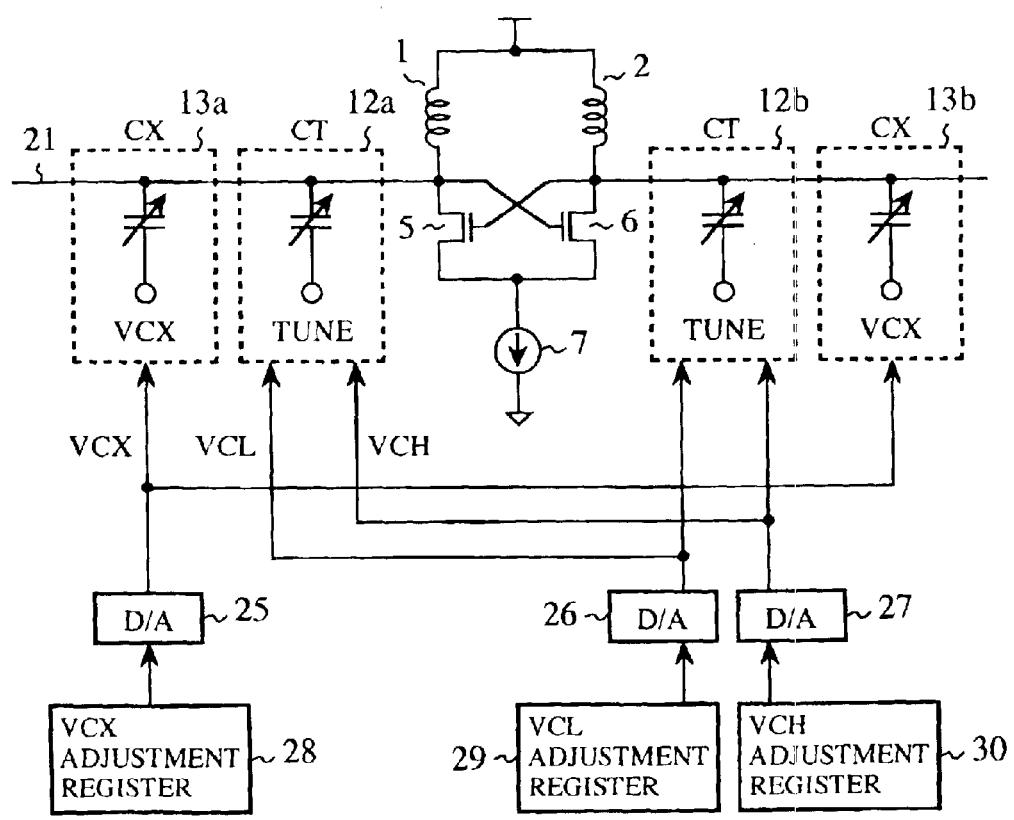
FIG. 16 is a circuit diagram showing a configuration of the LC oscillator of an embodiment 6 in accordance with the present invention.

FIG. 16 is a block diagram showing a configuration of the LC oscillator of an embodiment 6 in accordance with the present invention. In FIG. 16, the same reference numerals designate the same components as those of the LC oscillator as shown in FIG. 1. In this figure, reference numerals 25-27 each designate a digital-to-analog (D/A) converter, and 28-30 each designate an adjustment register. The adjustment register 28 (first adjustment register) holds a code (additional control voltage code) corresponding to the additional control voltage VCX. Likewise, an adjustment register 29 (third adjustment register) and adjustment register 30 (second adjustment register) hold the codes (first and second voltage codes) corresponding to the first and second voltages VCH and VCL.

The D/A converters 25, 26, and 27, receiving the additional control voltage code, second voltage code and first voltage code, respectively, carry out the D/A conversion of them to generate the additional control voltage VCX, second voltage VCL and first voltage VCH. The additional control voltage VCX is supplied to the first and second additional variable capacitor sections 13a and 13b, and the first and second voltages VCH and VCL are supplied to the first and second variable capacitor sections 12a and 12b. Thus, the oscillation frequency varies in response to the TUNE code as described in the foregoing embodiment 1. The additional control voltage VCX, second voltage VCL and first voltage VCH can be varied by varying the additional control voltage code, second voltage code and first voltage code.

Thus, installing the first to third adjustment registers makes it possible to carry out the frequency adjustment as described in the foregoing embodiment 1 at regular time intervals, and to update the additional control voltage code, second voltage code and first voltage code. As a result, the present embodiment 6 can adjust the oscillation frequency variations in the LC oscillator in the manufacturing process, and establish the oscillation frequency at the desired oscillation frequency regardless of the operation environment such as the ambient temperature.

The adjustment registers 28-30 and D/A converters 25-27 are provided as needed. When the additional control voltage VCX, second voltage VCL and first voltage VCH are necessary, all the adjustment registers 28-30 and D/A converters 25-27 must be installed. However, when the first and second additional variable capacitor sections 13a and 13b are unnecessary, the adjustment register 28 and D/A converter 25 can be removed.

As described above, the present embodiment 6 is configured such that it includes the first, second and third adjustment registers for holding the additional control voltage code, second voltage code and first voltage code, and carries out the frequency adjustment at regular time intervals to update the additional control voltage code, second voltage code and first voltage code in accordance with the result of the frequency adjustment. Thus, the present embodiment 6 can adjust the oscillation frequency variations in the LC oscillator in the manufacturing process, and establish the oscillation frequency at the desired oscillation frequency regardless of the operation environment such as the ambient temperature.

What is claimed is:

1. An LC oscillator that varies its oscillation frequency between a predetermined maximum oscillation frequency and minimum oscillation frequency, said LC oscillator comprising:

inductors;

variable capacitor means for varying its capacitance in response to a control voltage supplied in accordance with a digital control signal;

additional variable capacitor means for varying its capacitance in response to an additional control voltage; and adjusting means for adjusting the oscillation frequency to one of the maximum oscillation frequency and minimum oscillation frequency by varying the capacitance of said variable capacitor means by the control voltage when the digital control signal is set to a predetermined value, wherein said additional variable capacitor means adjusts the oscillation frequency to the other of the maximum oscillation frequency and minimum oscillation frequency by varying its capacitance by the additional control voltage when the digital control signal is set to the predetermined value.

2. The LC oscillator according to claim 1, wherein said variable capacitor means is composed of a MOS capacitor; said adjusting means adjusts the minimum oscillation frequency by determining a maximum capacitance of said variable capacitor means by the control voltage; and said additional capacitor means adjusts the maximum oscillation frequency by the additional control voltage.

3. The LC oscillator according to claim 1, wherein said variable capacitor means is composed of a MOS capacitor; said adjusting means adjusts the maximum oscillation frequency by determining a minimum capacitance of said variable capacitor means by the control voltage; and said additional capacitor means adjusts the minimum oscillation frequency by the additional control voltage.

4. The LC oscillator according to claim 1, wherein said variable capacitor means comprises first to Kth capacitors, where K is an integer greater than one; the digital control signal has K bits; and said adjusting means comprises buffer means for supplying said first to Kth capacitors with first to Kth control voltages generated in response to the digital control signal as the control voltage, and wherein said buffer means selectively generates one of a first voltage and a second voltage in response to a kth-bit value of the digital control signal as a kth control voltage, where k is an integer varying from one to K.

5. The LC oscillator according to claim 1, wherein said variable capacitor means comprises first to Kth capacitors; the digital control signal has K bits; said adjusting means comprises first to Kth switches connected in series with said first to Kth capacitor, and wherein a kth switch is turned on and off in response to a kth bit of the digital control signal to supply a kth capacitor of said variable capacitor means with the control voltage, where k is an integer varying from one to K.

6. The LC oscillator according to claim 1, further comprising register means for holding the control voltage and additional control voltage as a control voltage code and an additional control voltage code; and digital-to-analog converting means for carrying out digital-to-analog conversion of the control voltage code and additional control voltage code to the control voltage and additional control voltage.

7. An LC oscillator that varies its oscillation frequency between a predetermined maximum oscillation frequency and minimum oscillation frequency, said LC oscillator comprising:

inductors;

variable capacitor means for varying its capacitance in response to a control voltage supplied in accordance with a digital control signal; and adjusting means for adjusting the oscillation frequency to the maximum oscillation frequency and the minimum oscillation frequency by varying a first voltage and a second voltage when the digital control signal is set to a predetermined value, the first voltage and second voltage being selectively supplied to said adjusting means in response to the digital control signal, and the first voltage being higher than the second voltage.

8. The LC oscillator according to claim 7, wherein said variable capacitor means comprises first to Kth capacitors, where K is an integer greater than one; the digital control signal has K bits; and said adjusting means comprises buffer means for supplying said first to Kth capacitors with first to Kth control voltages generated in response to the digital control signal as the control voltage, and wherein said buffer means selectively generates one of a first voltage and a second voltage in response to a kth-bit value of the digital control signal as a kth control voltage, where k is an integer varying from one to K.

9. The LC oscillator according to claim 7, further comprising register means for holding the control voltage as a control voltage code, and digital-to-analog converting means for carrying out digital-to-analog conversion of the control voltage code to the control voltage.

* * * * *